(12) United States Patent
Kolan et al.

(10) Patent No.: US 7,883,938 B2
(45) Date of Patent: Feb. 8, 2011

(54) STACKED DIE SEMICONDUCTOR PACKAGE AND METHOD OF ASSEMBLY

(75) Inventors: Ravi Kanth Kolan, Singapore (SG); Anthony Sun Yi Sheng, Singapore (SG); Liu Hao, Singapore (SG); Toh Chin Hock, Singapore (SG)

(73) Assignee: United Test and Assembly Center Ltd., Singapore (SG)

( * ) Notice: Subject to any disclaimer, the term of this patent is extended or adjusted under 35 U.S.C. 154(b) by 337 days.

(21) Appl. No.: 12/124,880

(22) Filed: May 21, 2008

(65) Prior Publication Data

US 2009/0004777 A1 Jan. 1, 2009

Related U.S. Application Data

(60) Provisional application No. 60/939,574, filed on May 22, 2007.

(51) Int. Cl.
*H01L 21/00* (2006.01)
(52) U.S. Cl. ............... 438/109; 438/107; 438/110; 257/E23.172
(58) Field of Classification Search .......... 257/E23.172; 438/107, 109, 110
See application file for complete search history.

(56) References Cited

U.S. PATENT DOCUMENTS

| 6,946,323 | B1 | 9/2005 | Heo |
| 7,276,799 | B2 | 10/2007 | Lee et al. |
| 2003/0160312 | A1 | 8/2003 | Lo et al. |
| 2004/0063246 | A1 | 4/2004 | Karnezos |
| 2005/0046002 | A1* | 3/2005 | Lee et al. ............... 257/678 |
| 2005/0048698 | A1 | 3/2005 | Yamaguchi |

* cited by examiner

*Primary Examiner*—Bradley K Smith
*Assistant Examiner*—Marvin Payen
(74) *Attorney, Agent, or Firm*—Sughrue Mion, PLLC

(57) ABSTRACT

A method of manufacturing a plurality of stacked die semiconductor packages, including: attaching a second silicon wafer to a first silicon wafer, wherein the second silicon wafer has a plurality of open vias; attaching a third silicon wafer to the second silicon wafer, wherein the third silicon wafer has a plurality of open vias, and the open vias of the second and third silicon wafers are aligned with one another; etching a bonding material that attaches the wafers from the aligned open vias; filling the aligned open vias with a conductor; forming conductive bumps at open ends of the aligned open vias; back grinding the first silicon wafer; separating the stacked semiconductor dies from each other; attaching the bump end of the stacked semiconductor dies onto a substrate; encapsulating the stacked semiconductor dies and substrate; and singulating the encapsulated assembly.

7 Claims, 4 Drawing Sheets

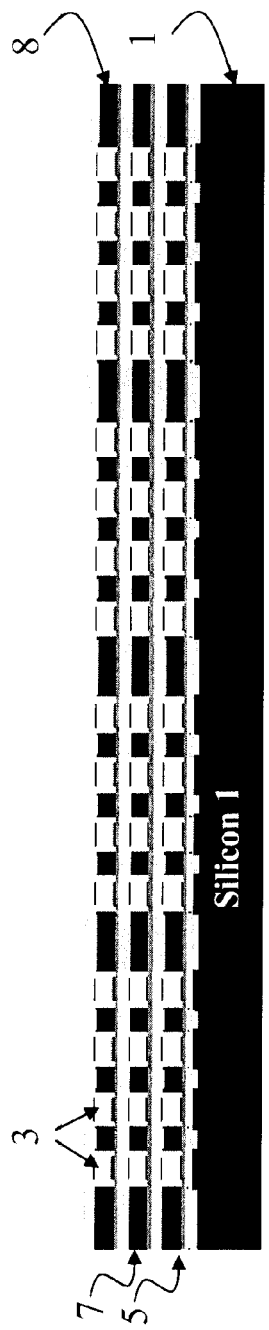
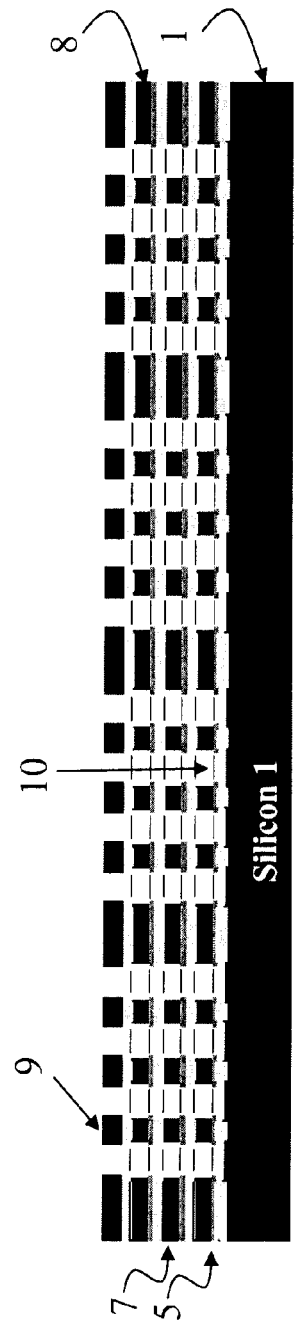
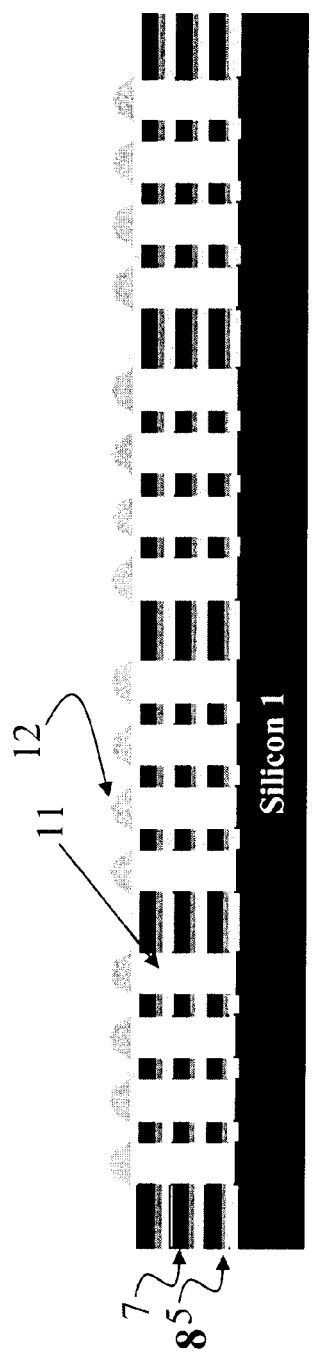

STACKED DIE SEMICONDUCTOR PACKAGE AND METHOD OF ASSEMBLY

CROSS-REFERENCE TO RELATED APPLICATIONS

This application claims priority from U.S. Provisional Application No. 60/939,574 filed on May 22, 2007, the disclosure of which is incorporated herein by reference.

BACKGROUND OF INVENTION

1. Field of Invention

Methods consistent with the present invention relate to a stacked die semiconductor package. More particularly, the method relates to through-silicon vias (TSV) interconnect 3-D packages. The method uses wafers that have been processed (i.e., blind etched, back grinded, laminated with bond material at underside, etc) to form the stacked a structure.

2. Background and Description of the Related Art

The relatively new through-silicon vias, or TSV, technique involves stacking chips vertically in a package and then creating connections between the bottom of the top chip and the top of the bottom chip. Major challenges in TSV interconnect 3-D packaging include: (1) how to handle thin wafers; (2) new equipment to handle wafer level operations; and (3) testing TSV wafers. Other concerns include reliability and "void" and "pop-corn" issues, which typically arise due to vapor trapped within the package. In addition, each wafer of the stack is subjected to a plating process which is long and time consuming, which hampers production capacity.

Conventional TSV packages are handled using expensive wafer handling equipment with temporary carrier bonding. Identifying a bonding material that can withstand high temperature metal deposition processes is another major challenge. De-bonding is another high risk process which can damage the wafer, which has already undergone all the front end operations.

One convention TSV method is disclosed in U.S. Pat. No. 7,276,799. The chip stack package in this patent is manufactured at a wafer level by forming connection vias in the scribe lanes adjacent the chips and connecting the device chip pads to the connection vias using rerouting lines. A lower chip is then attached and connected to a substrate, which may be a test wafer, and an upper chip is attached and connected to the lower chip, the electrical connections being achieved through their respective connection vias. In addition to the connection vias, the chip stack package may include connection bumps formed between vertically adjacent chips and/or the lower chip and the substrate. However, this method may create reliability issues resulting from inadequate contact between bond pad, the conductive coating and the solder material within the apertures.

There is therefore a need to provide a method that can prevent or at least ameliorate on or more of the disadvantages of the prior art. One objective of the present invention is to have a simpler assembly process that leads to a better interconnect reliability package. The package will also have better electrical and mechanical performance.

SUMMARY OF THE INVENTION

Exemplary embodiments of the present invention overcome the above disadvantages and other disadvantages not described above. Also, the present invention is not required to overcome the disadvantages described above, and an exemplary embodiment of the present invention may not overcome any of the problems described above.

In an embodiment of the invention, the through-silicon vias are plated after all of the devices are stacked. The invention eliminates thin wafer handling requirements and micro-bump IMC/reliability issues that result from repeated reflows. The invention also uses standard material sets and equipment that are used for stacking wire-bonded devices. Simple process flows, enhanced TSV interconnect and electrical and mechanical performance are key features of the method. The ability to handle either wafer-to-wafer bonding or chip-to-wafer bonding is also an advantage of the process.

In a first aspect, there is provided a method of manufacturing a plurality of stacked die semiconductor packages, that includes the following steps:

attaching a bottom surface of a second silicon wafer to a top surface of a first silicon wafer, wherein the second silicon wafer has a plurality of open vias and a layer of bonding material at the bottom surface;

attaching a bottom surface of a third silicon wafer to a top surface of the second silicon wafer, wherein the third silicon wafer has a plurality of open vias and a layer of bonding material at the bottom surface, and the open vias of the second and third silicon wafers are aligned with one another;

etching the bonding material from the aligned open vias;

filling the aligned open vias with a conductor;

forming conductive bumps at open ends of the aligned open vias;

back grinding a bottom surface of the first silicon wafer;

separating the stacked semiconductor dies from each other;

attaching the bump end of the separated stacked semiconductor dies onto a substrate;

encapsulating the separated stacked semiconductor dies and substrate; and singulating the encapsulated assembly into individual stacked die semiconductor packages.

BRIEF DESCRIPTION OF THE DRAWINGS

The above and/or other aspects of the present invention will become apparent and more readily appreciated from the following description of the exemplary embodiments, taken in conjunction with the accompanying drawings, in which:

FIG. 2-12 illustrate an embodiment of the inventive method.

DETAILED DESCRIPTION OF EXEMPLARY EMBODIMENTS OF THE INVENTION

Hereinafter, exemplary embodiments of the present invention will be described with reference to the accompanying drawings.

A novel feature of this invention is the one time plating of the silicon stack and single bumping the interconnect for the whole 3D stack. As a result, one time reflow, standard assembly processes like flip chip attach, under-fill, molding, ball mount and singulation can be used. The package results in better interconnect reliability and electrical and mechanical performance.

Figure 1:
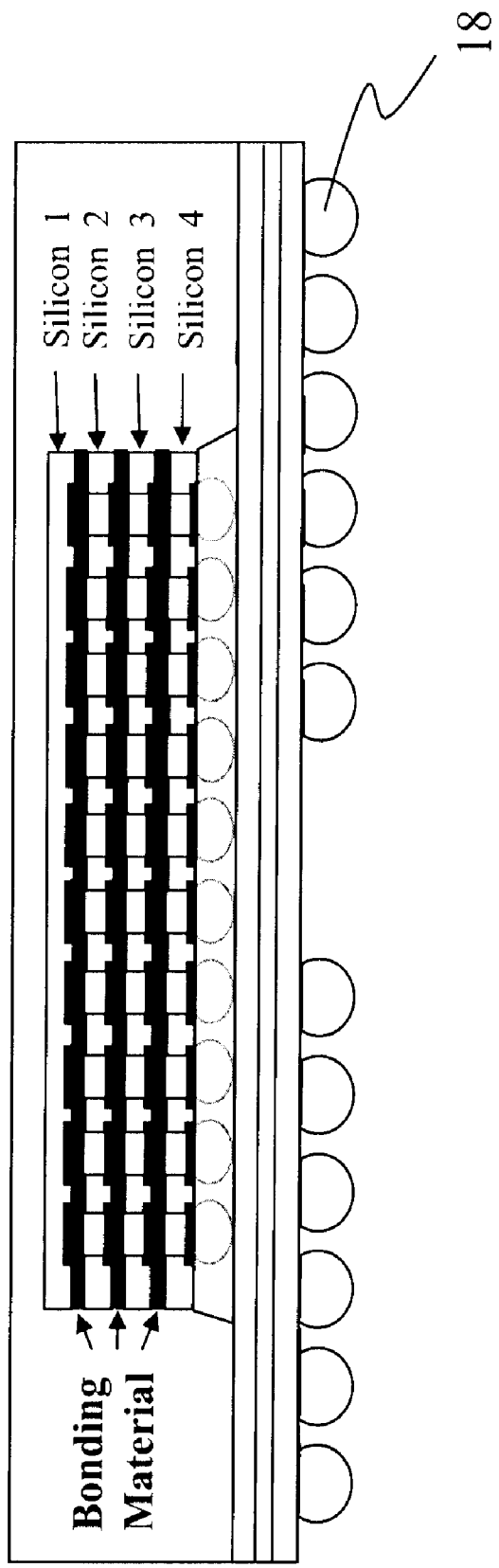
FIG. 1 illustrates an embodiment of the inventive package.

FIG. 1 shows an embodiment of a 3-D TSV package manufactured by the new method shown in more detail in FIGS. 2-12.

Figure 2:

FIG. 2 show a first silicon wafer 1. A passivation layer 2 is formed on top of silicon wafer 1 creating holes 17 that will be in alignment with subsequently formed through-vias.

Figure 3:

FIG. 3 shows a second silicon wafer 5. Prior to being assembled in the method, silicon wafer 5 is preprocessed by being blind etched to form holes 3. The holes 3 are coated with an insulating layer (not shown) such as silicon dioxide followed by a metal seed layer (not shown) on the insulating layer. The surface of the wafer where the holes 3 are formed, is also plated with a redistribution layer (RDL) and a passivation layer over the RDL, both collectively referred to as numeral 4.

Figure 4:
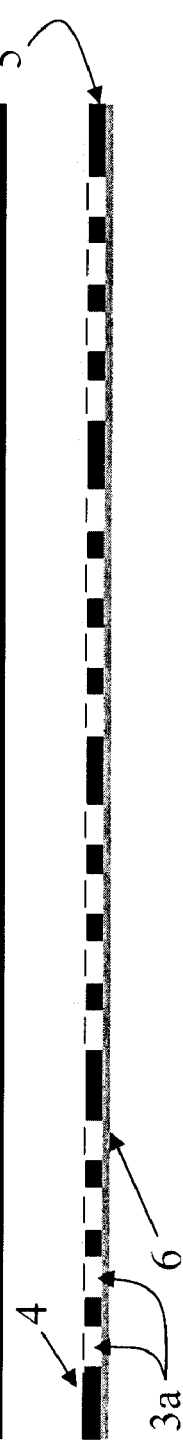

The bottom of silicon wafer 5 is back ground to create through vias 3a and as shown in FIG. 4, a bonding material 6, such as an adhesive tape, is laminated to the back ground surface.

Figure 5:
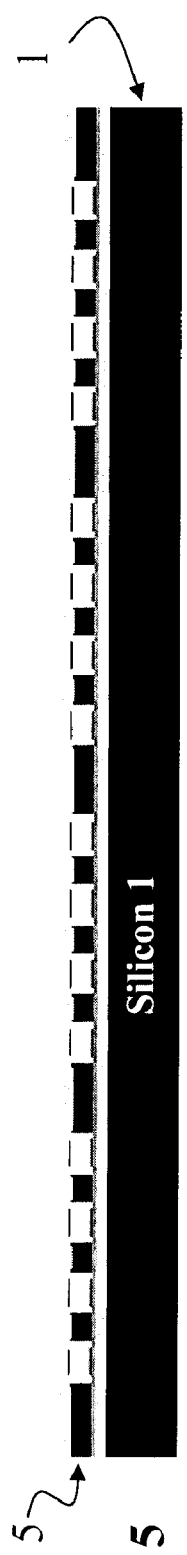

Next, as shown in FIG. 5, silicon wafer 5 is placed over silicon wafer 1 such that the through vias 3a are aligned with the holes 17 in silicon wafer 1. Silicon wafer 5 is then hot laminated to silicon wafer 1. Other methods suitable for bonding the wafers may also be used.

FIG. 6 shows the package after additional third and fourth silicon wafers 7 and 8 have been assembled. Like silicon wafer 5, prior to being assembled, each of silicon wafers 7 and 8 are blind etched to form holes 3 and have an insulating layer (such as silicon dioxide) and metal seed layer deposited on the walls of the holes 3. The surfaces of the wafers where the holes are formed are also plated with an RDL and passivated. The bottoms of silicon wafers 7 and 8 are back ground to create through vias and a bonding material is laminated to the back ground surfaces.

Next, silicon wafer 7 is aligned over silicon wafer 5 and hot laminated to silicon wafer 5, then silicon wafer 8 is aligned over silicon wafer 7 and hot laminated to silicon wafer 7.

Then, as shown in FIG. 7, a photo resist 9 is applied to the top of the stack of wafers and patterned to create openings that align with the through vias. Etching is then performed to remove the bonding material between the silicon wafers that is in the through vias 10. Additional seed metal deposition can also be performed at this time. Then, the photo resist is stripped off.

Then, as shown in FIG. 8, the vias 11 are plated with a conductor, such as copper, and bumps 12 are formed at the ends of the vias. Silicon wafer 1 is then back ground, as shown in FIG. 9.

Figure 9:
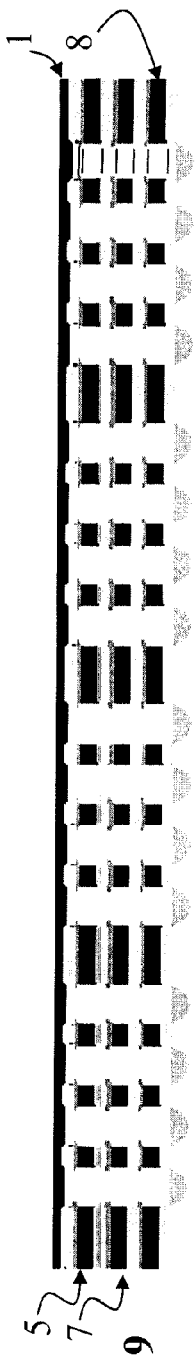
Figure 10:
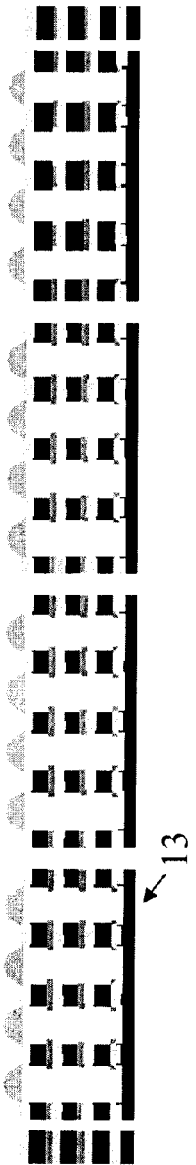

Next, as shown in FIG. 9, dicing of the stacked wafers is performed using a UV tape 13 for support. After dicing, the diced wafer stacks are exposed to UV light for easy release of the individual diced units from the UV tape.

Figure 11:
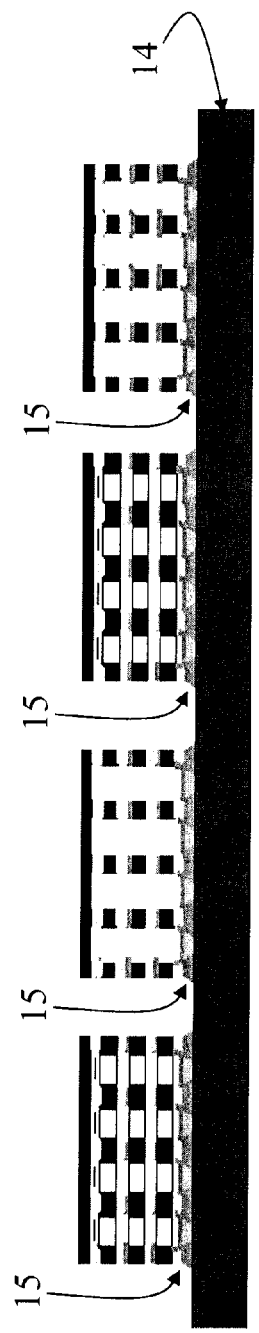
Figure 12:
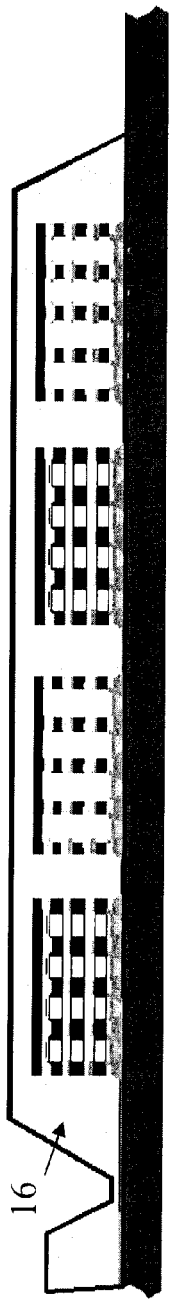

The diced units are then flip chip attached on a substrate, with the bump end on the substrate, and underfilled 15, as shown in FIG. 11. Next a standard molding operation is performed to encapsulate the individual diced units, as shown in FIG. 12.

Finally, the units are singulated into individual packages and ball mounted with solder balls 18, as shown in FIG. 1.

Although the embodiment shown in FIG. 1 has four silicon wafers, the invention is not limited to packages with four wafers. Packages with fewer or more wafers can also be manufacture with the inventive method.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing a plurality of stacked die semiconductor packages, comprising:

attaching a bottom surface of a second silicon wafer to a top surface of a first silicon wafer, said second silicon wafer having a plurality of unfilled vias and a layer of bonding material at the bottom surface;

attaching a bottom surface of a third silicon wafer to a top surface of the second silicon wafer, said third silicon wafer having a plurality of unfilled vias and a layer of bonding material at the bottom surface, and said unfilled vias of the second and third silicon wafers are aligned with one another;

removing said bonding material from said aligned unfilled vias;

filling said aligned unfilled vias with a conductor;

forming conductive bumps at ends of said aligned vias;

back grinding a bottom surface of said first silicon wafer;

separating said stacked semiconductor dies from each other;

attaching the bump end of said separated stacked semiconductor dies onto a substrate;

encapsulating said separated stacked semiconductor dies and substrate; and singulating said encapsulated assembly into individual stacked die semiconductor packages.

2. The method of claim 1, further comprising:

back grinding a bottom surface on at least one of said second and third silicon wafers prior to applying said layer of bonding material.

3. The method of claim 1, further comprising:

blind etching a top surface on at least one of said second and third silicon wafers prior to applying said layer of bonding material.

4. The method of claim 3, further comprising:

applying an insulating layer to said blind etched top surface on at least one of said second and third silicon wafers prior to applying said layer of bonding material.

5. The method of claim 4, further comprising:

applying a metal layer over said insulating layer on at least one of said second and third silicon wafers prior to applying said layer of bonding material.

6. The method of claim 5, further comprising:

passivating at least one of said second and third silicon wafers prior to applying said layer of bonding material.

7. The method of claim 1, further comprising:

attaching a bottom surface of a fourth silicon wafer to a top surface of the third silicon wafer, said fourth silicon wafer having a plurality of unfilled vias and a layer of bonding material at the bottom surface, and said unfilled vias of the second, third and fourth silicon wafers are aligned with one another.

* * * * *